US012591184B2

(12) United States Patent　　　　(10) Patent No.: US 12,591,184 B2
Goorden et al.　　　　　　　　　　　(45) Date of Patent:　Mar. 31, 2026

(54) ENHANCED ALIGNMENT FOR A PHOTOLITHOGRAPHIC APPARATUS

(71) Applicant: ASML Netherlands B.V., Veldhoven (NL)

(72) Inventors: Sebastianus Adrianus Goorden, Eindhoven (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 185 days.

(21) Appl. No.: 18/721,718

(22) PCT Filed: Dec. 14, 2022

(86) PCT No.: PCT/EP2022/085778
　　§ 371 (c)(1),
　　(2) Date: Jun. 19, 2024

(87) PCT Pub. No.: WO2023/126174
　　PCT Pub. Date: Jul. 6, 2023

(65) Prior Publication Data
US 2025/0053106 A1　　Feb. 13, 2025

Related U.S. Application Data

(60) Provisional application No. 63/294,413, filed on Dec. 29, 2021.

(51) Int. Cl.
　　G03F 9/00　　　　(2006.01)
(52) U.S. Cl.
　　CPC .......... G03F 9/7088 (2013.01); G03F 9/7003 (2013.01); G03F 9/7092 (2013.01)

(58) Field of Classification Search
　　CPC ..... G03F 9/7088; G03F 9/7003; G03F 9/7092
(Continued)

(56) References Cited

U.S. PATENT DOCUMENTS 5,894,350 A　　4/1999　Hsieh et al.
6,297,876 B1　10/2001　Bornebroek
(Continued)

FOREIGN PATENT DOCUMENTS

NL　　　　2019155 A　　3/2018
WO　　2020057900 A1　3/2020
(Continued)

OTHER PUBLICATIONS

Y. Blancquaert et al. "Performance of ASML Yield Star μDBO overlay targets for advanced lithography nodes C028 and C014 overlay process control," Metrology, Inspection, and Process Control for Microlithography XXVII, Proc. of SPIE, vol. 8681 (2013).
(Continued)

*Primary Examiner* — Isiaka O Akanbi
(74) *Attorney, Agent, or Firm* — DiBerardino McGovern IP Group LLC

(57)　　　　ABSTRACT

Disclosed is an apparatus for and method of using local alignment position deviation parameters for alignment marks on a semiconductor wafer wherein the parameters are used to generate one or more values indicating a condition of the alignment marks, which values may be used to obtain an wafer grid model having an improved fit.

15 Claims, 10 Drawing Sheets

(58) Field of Classification Search
USPC ................................................. 356/399–401
See application file for complete search history.

(56) References Cited

U.S. PATENT DOCUMENTS

| | | | |
|---|---|---|---|
| 6,961,116 B2 | 11/2005 | Den Boef et al. | |
| 8,208,121 B2 | 6/2012 | Bijnen et al. | |
| 8,576,374 B2 | 11/2013 | Best et al. | |
| 8,982,347 B2 * | 3/2015 | Wei ....................... | G03F 9/7046 |
| | | | 356/399 |
| 9,606,442 B2 | 3/2017 | Mathijssen et al. | |
| 9,733,572 B2 | 8/2017 | Mathijssen | |
| 9,927,772 B2 | 3/2018 | Stranczl et al. | |
| 10,901,326 B2 | 1/2021 | Hulsebos et al. | |
| 11,086,232 B2 | 8/2021 | Sciacca et al. | |
| 11,989,872 B2 * | 5/2024 | Weiss .................... | H04N 23/56 |
| 2005/0002035 A1 * | 1/2005 | Mishima ............... | G03F 9/7026 |
| | | | 355/53 |
| 2007/0020785 A1 * | 1/2007 | Bruland .............. | H01L 23/5258 |
| | | | 257/E23.15 |
| 2013/0141723 A1 * | 6/2013 | Wei ....................... | G03F 9/7046 |
| | | | 356/400 |
| 2015/0146188 A1 * | 5/2015 | Lyulina ............... | G03F 7/70141 |
| | | | 356/614 |
| 2019/0137892 A1 * | 5/2019 | Cekli ...................... | H01L 22/12 |
| 2021/0124276 A1 | 4/2021 | Goorden et al. | |
| 2022/0397832 A1 * | 12/2022 | Alpeggiani ......... | G03F 7/70091 |

FOREIGN PATENT DOCUMENTS

| | | |
|---|---|---|
| WO | 2021008794 A1 | 1/2021 |
| WO | 2021037867 A1 | 3/2021 |
| WO | 2021233642 A1 | 11/2021 |

OTHER PUBLICATIONS

"Metrology Method and System and Lithographic System," Research Disclosure, Kenneth Mason Publications, Hampshire, UK, GB vol. 691, No. 65 Nov. 1, 2021 (Nov. 1, 2021).

Klaus Eisner, European Patent Office, International Search Report and Written Opinion, counterpart PCT Application No. PCT/EP2022/085778, mailed Apr. 17, 2023, 12 total pages.

* cited by examiner

DETERMINE ALIGNED POSITION FOR EACH
POINT IN A SET OF POINTS IN A MARK          S10

COMBINE ALIGNED POSITIONS INTO WAFER
GRID          S20

410        415        420        425

400

460        465        470

450

ENHANCED ALIGNMENT FOR A PHOTOLITHOGRAPHIC APPARATUS

CROSS-REFERENCE TO RELATED APPLICATIONS

This application claims priority of U.S. Provisional Patent Application No. 63/294,413, which was filed on Dec. 29, 2021, and which is incorporated herein in its entirety by reference.

FIELD

The present disclosed subject matter relates to methods and apparatus usable, for example, in the manufacture of devices by lithographic techniques, and to methods of manufacturing devices using lithographic techniques. The present disclosed subject matter relates in particular to methods of and apparatus for obtaining alignment information in a lithographic apparatus and process.

BACKGROUND

A lithographic apparatus applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern with a radiation beam in a given direction (the scanning direction) while synchronously scanning the substrate parallel or anti parallel to this direction. It is also possible to transfer the pattern from the patterning device to the substrate by imprinting the pattern onto the substrate.

ICs are built up layer-by-layer, and modern ICs can have thirty or more layers. On Product Overlay (OPO) is a measure of a system's ability to place the applied pattern correctly and accurately in relation to features laid down (by the same apparatus or a different lithographic apparatus) in previous layers. Successive layers or multiple processes on the same layer must be accurately aligned to the previous layer. Otherwise, electrical contact between structures will be impaired and the resulting devices will not perform to specification. Good overlay improves device yield and enables smaller product patterns to be printed. The overlay error between successive layers formed in or on the patterned substrate is controlled by various parts of the exposure subsystem of the lithographic apparatus.

In order to control the lithographic process to place device features accurately on the substrate, one or more alignment marks are generally provided on, for example, the substrate, and the lithographic apparatus includes one or more alignment systems by which the position of the mark may be measured accurately. The alignment sensor may be effectively a position measuring apparatus. Different types of marks and different types of alignment systems are known from different times and different manufacturers. Types of alignment marks include bidirectional fine (BF) wafer alignment marks and smaller format marks such as micro diffraction based overlay (uDBO) alignment marks (e.g., C16 or C10 marks) for applications such as intra-field wafer alignment and wafer edge correction. Also known are cDBO (continuous bias DBO) targets that have a slightly different pitch between top and bottom grating, which has the effect of having a different bias values along the grating length.

In general, the overlay error can be divided into two classes: intra-field and inter-field. Intra-field errors include symmetric rotation, asymmetric rotation, symmetric magnification, and asymmetric magnification. They are generally displacements caused by fitting problems between the mask and the aerial image. Inter-field errors arise from displacements caused by fitting problems between the aerial image and wafer. Inter-field errors include translation, rotation, and scaling.

Generally marks are measured separately to obtain x- and y-positions. However, combined x-measurement and y-measurement can be performed using the techniques described in U.S. Pat. No. 8,208,121, issued Jun. 26, 2012, and titled "Alignment Mark and a Method of Aligning a Substrate Comprising Such an Alignment Mark." Modifications and applications of such sensors are described in U.S. Pat. No. 9,733,572, issued Aug. 15, 2017, and titled "Method and Apparatus for Measuring Asymmetry of a Microstructure, Position Measuring Method, Position Measuring Apparatus, Lithographic Apparatus and Device Manufacturing Method" and in U.S. Pat. No. 9,927,772, issued Mar. 27, 2018, and titled "Polarization Independent Interferometer."

All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls.

Lithographic apparatus are known to use multiple alignment systems to align the substrate with respect to the lithographic apparatus. The data can for example be obtained with any type of alignment sensor, for example a SMASH (SMart Alignment Sensor Hybrid) sensor, as described in U.S. Pat. No. 6,961,116, issued Nov. 1, 2005 and titled "Lithographic Apparatus, Device Manufacturing Method, and Device Manufactured Thereby" that employs a self-referencing interferometer with a single detector and four different wavelengths, and extracts the alignment signal in software. Also known is ATHENA (Advanced Technology using High order ENhancement of Alignment), as described in U.S. Pat. No. 6,297,876, issued Oct. 2, 2001, and titled "Lithographic Projection Apparatus with an Alignment System for Aligning Substrate on Mask," which directs each of seven diffraction orders to a dedicated detector, or the ORION sensor which uses multiple polarizations per available signal (color).

Another known alignment system is described in WIPO International Pub. No. WO 2020/057900, published Mar. 26, 2020, and titled "Metrology Sensor for Position Metrology." This describes a metrology device with optimized coherence. More specifically, the metrology device is configured to produce a plurality of spatially incoherent beams of measurement illumination, each of the beams (or both beams of measurement pairs of the beams, each measurement pair corresponding to a measurement direction) having corresponding regions within their cross-section for which the phase relationship between the beams at these regions is known, i.e., there is mutual spatial coherence for the corresponding regions.

The alignment data obtained by the sensing systems, taken just before exposure, are used to generate an alignment model or wafer grid with parameters that fit the model to the data. As an example the fit may be a polynomial fit of the data with the actual wafer deformation, with more data permitting the use of higher order polynomials yielding a better fit, but other types of fits may be used. These parameters and the alignment model are used during the exposure operation to correct positions of patterns applied in the current lithographic step. A conventional alignment model might comprise four, five or six parameters, together defining translation, rotation and scaling of the "ideal" grid, in different dimensions. Advanced models are known that use more parameters.

In a lithographic apparatus being used to process a wafer, the goal of the wafer alignment subsystem may thus be to provide an accurate description of the wafer grid. The wafer grid maps a distribution of alignment marks across a wafer. The wafer grid is translated into a proper description for correcting exposure. An important prerequisite is an accurate and reliable measurement of the alignment marks on the wafer by the alignment system. The deviations of the measured positions of the marks from their expected positions in an ideal grid is referred to as alignment mark position displacements or deviations (APDs).

In general, an APD for each of several alignment marks will be measured across the substrate using the alignment sensor AS. These measurements are used to establish a "wafer deformation grid", which maps very accurately the distribution of marks across the substrate, including any positional distortion relative to a nominal rectangular grid. In the ideal scenario where the alignment marks are perfectly symmetric, assuming no local wafer deformation, the APD for a mark is zero, resulting in the best overlay. However, as a result of processing, such as etching, chemical-mechanical polishing (CMP), annealing, deposition, oxidation, etc., real alignment marks are deformed in various ways, often resulting in asymmetries, which are not known beforehand. Typical asymmetries observed include Floor Tilt (FT), Top Tilt (TT) and Side Wall Angle (SWA). When radiation coming from the alignment sensor interacts with the alignment mark and diffracts, such diffracted radiation also contains information regarding the mark geometry. Therefore, for asymmetric (deformed) alignment marks, the sensor detects a position that differs from the real position on the wafer: the APD is nonzero.

There is considerable motivation for semiconductor manufacturers to seek to use more alignment marks to obtain more alignment data and so to develop more accurate, higher order fits. The use of more marks, however, requires that the marks be made smaller. Also, the time required to measure more marks has the potential to have an adverse effect on wafer throughput. It would be beneficial to obtain more alignment data without having to measure more marks and without compromising throughout. It is in this context that the need for the presently disclosed subject matter arises.

SUMMARY

The following presents a concise summary of one or more embodiments in order to provide a basic understanding of the present invention. This summary is not an extensive overview of all contemplated embodiments and is not intended to identify key or critical elements nor delineate the scope of any or all possible embodiments. Its sole purpose is to present some concepts relating to one or more embodiments in a succinct form as a prelude to the more detailed description that is presented later.

According to one aspect of an embodiment there is disclosed a metrology device comprising an optical system configured to collect radiation that has interacted with an alignment mark on a substrate and a processing system configured to receive and derive information from the collected radiation and to determine an aligned position for at least each of a subset of points in the alignment mark therefrom, the processing system being further configured to determine four wafer deformation gradients dAPD_x/dx, dAPD_x/dy, dAPD_y/dx, and dAPD_y/dy based on the aligned positions. The processor may be configured to use the four wafer deformation gradients to perform a wafer grid fit.

According to another aspect of an embodiment there is disclosed a metrology device comprising an optical system configured to collect radiation that has interacted with an alignment mark on a substrate and a processing system configured to receive and derive information from the collected radiation and to determine at least two alignment position deviations (APDs) of the alignment mark therefrom, the processing system being further configured to determine at least one of a gradient measurement or a rotation measurement Rz based at least in part on the at least two APDs. The at least one alignment mark may have a characteristic linear dimension D and the processing system may be additionally configured to determine the rotation measurement Rz based at least in part on D.

The substrate may lie in a plane that extends in an x dimension and in a y dimension orthogonal to the x dimension, wherein the at least two APDs are in one of the x dimension and the y dimension, and the rotation measurement Rz may be around an axis extending through the alignment mark in a z dimension orthogonal to the x dimension and the y dimension.

A first one of the at least two APDs may be a first ADP in the y dimension APD_y1 and a second one of the at least two APDs may be a second APD in the y dimension APD_y2 and wherein Rz is determined as a difference between APD_y1 and APD_y2 divided by D.

The processing system may be additionally configured to determine a first x APD in the x dimension APD_x1 and a second x APD in the x dimension APD_x2 and a second Rz may be determined as a difference between APD_x1 and APD_x2 divided by a characteristic linear dimension D2.

The optical system may be configured to collect radiation that has interacted with a plurality of alignment marks and the processing system may be additionally configured to receive and derive information from the collected radiation from each of the plurality of alignment marks and to determine at least two APDs for each of the plurality of alignment marks therefrom, the processing system being further configured to determine at least one rotation measurement Rz for each of the plurality of alignment marks based at least in part on the respective at least two APDs for each of the plurality of alignment marks, and wherein the processor is further configured to determine a rotation gradient for the substrate based at least in part on the at least one rotation measurement Rz for each of the plurality of alignment marks.

The optical system may be configured to collect radiation that has interacted with a plurality of alignment marks and the processing system may be additionally configured to receive and derive information from the collected radiation from each of the plurality of alignment marks and to determine at least two APDs for each of the plurality of alignment marks therefrom, the processing system being further configured to determine at least one rotation measurement Rz for each of the plurality of alignment marks based at least in part on the respective at least two APDs, and wherein the processor is further configured to determine a mathematical fit for a wafer model for the substrate based at least in part on the at least one rotation measurement Rz for each of the plurality of alignment marks. The mathematical fit may be a polynomial fit.

According to another aspect of an embodiment there is disclosed a metrology method comprising causing radiation to interact with at least one alignment mark on a substrate lying substantially in a plane, sensing the radiation, determining an aligned position for at least each of a subset of points in the alignment mark, and determining four wafer deformation gradients dAPD_x/dx, dAPD_x/dy, dAPD_y/dx, and dAPD_y/dy based on the aligned positions.

According to another aspect of an embodiment there is disclosed a metrology method comprising causing radiation to interact with at least one alignment mark on a substrate lying substantially in a plane, sensing the radiation, determining at least two alignment position deviations (APDs) of the at least one alignment mark from the radiation, and determining at least one rotation measurement Rz orthogonal to the plane of the at least one alignment mark based at least in part on the at least two APDs based at least in part on the at least two APDs.

The at least one alignment mark may have a characteristic linear dimension D and wherein determining the at least one rotation measurement Rz is based at least in part on D.

The plane may extend in an x dimension and in a y dimension orthogonal to the x dimension, wherein the at least two APDs are in one of the x dimension and the y dimension, and the rotation measurement Rz may be around an axis extending through the alignment mark in a z dimension orthogonal to the x dimension and the y dimension.

A first one of the at least two APDs may be a first alignment position deviation in the y dimension APD_y1 and a second one of the at least two APDs may be a second alignment position deviation in the y dimension APD_y2 and wherein Rz is determined as a difference between APD_y1 and APD_y2 divided by D.

The metrology method may additionally comprise determining a first x alignment position deviation in the x dimension APD_x1 and a second x alignment position deviation in the x dimension APD_x2 and determining a second Rz as a difference between APD_x1 and APD_x2 divided by a characteristic linear dimension D2.

The step of causing radiation to interact with at least one alignment mark on a substrate lying substantially in a plane may comprise causing radiation to interact a plurality of alignment marks on a substrate lying substantially in a plane, and determining at least two APDs of the at least one alignment mark from the radiation may comprise determining at least two APDs for each of the plurality of alignment marks, determining at least one rotation measurement Rz may comprise determining at least one rotation measurement Rz for each of the plurality of alignment marks based at least in part on the respective at least two APDs, and the method may further comprise determining a rotation gradient for the substrate based at least in part on the at least one rotation measurement Rz for each of the plurality of alignment marks.

The step of causing radiation to interact with at least one alignment mark on a substrate lying substantially in a plane may comprise causing radiation to interact a plurality of alignment marks on a substrate lying substantially in a plane, determining at least two APDs of the at least one alignment mark from the radiation may comprise determining at least two APDs for each of the plurality of alignment marks, and determining at least one rotation measurement Rz may comprise determining at least one rotation measurement Rz for each of the plurality of alignment marks based at least in part on the respective at least two APDs, and the method may further comprise determining a polynomial fit for a wafer model for the substrate based at least in part on the at least one rotation measurement Rz for each of the plurality of alignment marks.

According to another aspect of an embodiment there is disclosed a metrology method comprising obtaining an alignment position deviation measurement, correlating the alignment position deviation measurement to at least one of a rotation amount and a wafer deformation gradient, and approximating an actual wafer grid deformation on the basis of the rotation amount or the wafer deformation gradient.

The alignment position deviation measurement may comprise measuring a mark position. The alignment position deviation measurement may comprise measuring at least two discrete alignment position deviations. The alignment position deviation measurement may comprise measuring a continuous alignment position deviation.

Approximating an actual wafer grid deformation on the basis of the rotation amount or the wafer deformation gradient may comprise mathematically fitting the rotation amount or the wafer deformation gradient.

Further embodiments, features, and advantages of the subject matter of the present disclosure, as well as the structure and operation of the various embodiments are described in detail below with reference to accompanying drawings.

Figure 1:
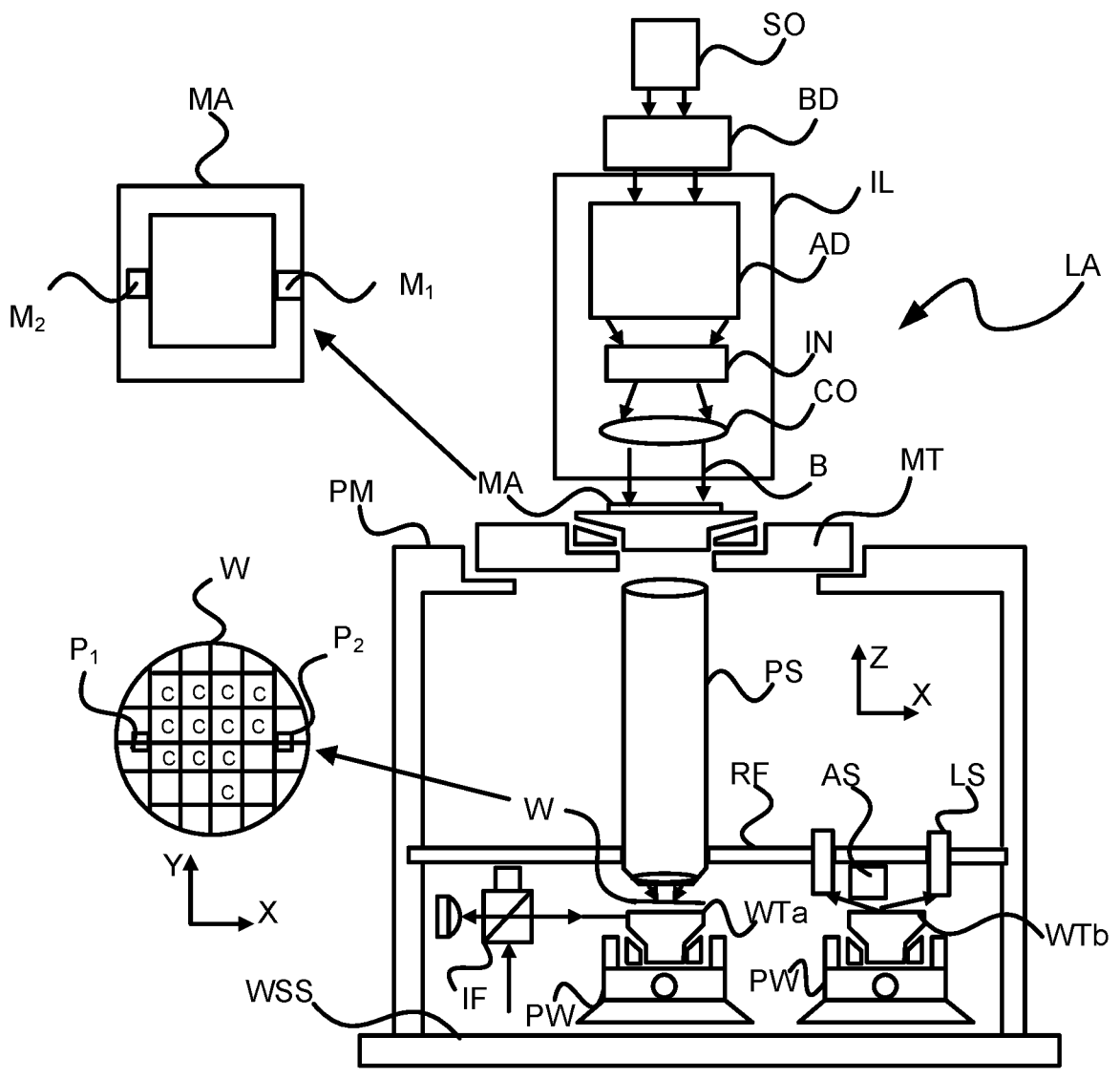
FIG. 1 shows a schematic, not to scale, view of an overall broad conception of a photolithography system.

Further features and advantages of the disclosed subject matter, as well as the structure and operation of various embodiments of the disclosed subject matter, are described in detail below with reference to the accompanying drawings. It is noted that the applicability of the disclosed subject matter is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be implemented or practiced without adopting the specific design details described below. In other instances, well-known structures and devices are shown in block diagram form in order to facilitate description of one or more embodiments.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others.

As an introduction, FIG. 1 schematically depicts an embodiment of a lithographic apparatus LA that may be included in and/or associated with the present systems and/or methods. The lithographic apparatus LA comprises an illumination system (illuminator) IL configured to condition a radiation beam B. The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The lithographic apparatus LA also comprises a support structure (e.g. a mask table) MT constructed to support a patterning device (e.g. a mask) MA and connected to a first positioner PM configured to accurately position the patterning device in accordance with certain parameters; one or more substrate tables (e.g. a wafer tables) WT (in the example, two wafer tables, WTa and WTb) configured to hold a substrate (e.g. a resist-coated wafer) W. Each wafer table is mechanically coupled to a respective positioner PW configured to accurately position the substrate on a wafer support surface WSS in accordance with certain parameters.

The lithographic apparatus LA also comprises a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame RF.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system. If the radiation source is of the type that produces EUV radiation then generally reflective optics will be used.

The illuminator IL may comprise an adjuster AD configured to adjust the angular and/or spatial intensity distribution of the beam. In addition, the illuminator IL generally comprises various other components, such as an integrator IN and a condenser CO. The illumination system may include various types of optical components for directing, shaping, or controlling radiation. Thus, the illuminator IL provides a conditioned beam of radiation B, having a desired uniformity and intensity distribution in its cross section.

The support structure MT supports the patterning device using mechanical, vacuum, electrostatic or other clamping techniques to hold the patterning device. The term "patterning device" used herein should be broadly interpreted as referring to any device that can be used to impart a pattern to a target portion of the substrate. Examples of patterning devices include masks, programmable mirror arrays, and programmable LCD panels. As depicted, the apparatus is of a transmissive type (e.g. employing a transmissive mask). Alternatively, the apparatus may be of a reflective type (e.g. employing a programmable mirror array of a type as referred to above or employing a reflective mask).

The relative phase of the projection system PS in its pupil plane may be determined by projecting radiation, for example from a point-like source in an object plane of the projection system PS (i.e. the plane of the patterning device MA), through the projection system PS and using a shearing interferometer IF to measure a wavefront (i.e. a locus of points with the same phase). The shearing interferometer may comprise a diffraction grating, for example a two dimensional grid, in an image plane of the projection system (i.e. the substrate table WTa or WTb) and a detector arranged to detect an interference pattern in a plane that is conjugate to a pupil plane of the projection system PS. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. The grating may be stepped in a direction perpendicular to the diffraction grating (z direction) to calibrate the detector.

The lithographic apparatus may be of a type having two (dual stage) or more tables (e.g., two or more substrate tables WTa, WTb, two or more patterning device tables, or a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the patterned radiation beam B passes through the projection system PS, which focuses the beam onto a target portion C of the substrate W. With the aid of its respective positioner PW and position sensor IF (e.g. an interferometric device, linear encoder, 2-D encoder, or capacitive sensor), the wafer table WTa or WTb can be moved accurately, e.g. to position different target portions C in the path of the radiation beam B. Similarly, another positioner and another position sensor (which are not explicitly depicted in FIG. 1) can be used to accurately position the patterning device MA with respect to the path of the radiation beam B, e.g. after mechanical retrieval from a mask library, or during a scan.

Patterning device MA and substrate W may be aligned using patterning device alignment marks M1, M2 and substrate alignment marks P1, P2. Although the substrate alignment marks as illustrated occupy dedicated target portions, they may be located in spaces between target portions (scribe-lane alignment marks). Similarly, in situations in which more than one die is provided on the patterning device MA, the patterning device alignment marks may be located between the dies.

The substrate referred to herein may be processed, before or after exposure, in a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes one or more processed layers.

Particularly for the problem of improving overlay performance, new patterns must be applied in exactly the correct position on a layer in a substrate that has already been subjected to one or more cycles of patterning and processing. Each patterning step can introduce positional deviations in the applied pattern, while subsequent processing steps progressively introduce distortions in the substrate and/or the pattern applied to it, that must be measured and corrected for, to achieve satisfactory overlay performance. Several alignment marks across the substrate W will be measured using alignment sensor AS. These measurements are used to establish a substrate model ("wafer grid"), which maps very accurately the distribution of marks across the substrate, including any distortion relative to a nominal rectangular grid.

The measurements of alignment data, for example, comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation, and scaling of the "ideal" grid, in different dimensions. Advanced models are known that use more parameters.

According to one aspect of an embodiment, a locally determined position distribution (e.g., a local phase map or local phase distribution or more generally a local parameter map or local parameter distribution), often referred to local aligned position deviation LAPD, is used to calibrate a correction which minimizes finite size effects. At a high level, a local phase determination method may comprise mapping a signal S (x, y). In the example that follows, a 2D signal, e.g., a camera image, is used as a nonlimiting concrete example to facilitate explanation, but one of ordinary skill in the art will appreciate that the concepts apply to signals in any dimension.

The signal S(x,y) is mapped into a set of spatial-dependent quantities $a_n(x, y)$, n=1, 2, 3, 4 . . . which are related to the metrology parameter of interest. The mapping can be achieved by defining a set of basis functions, e.g., $B_n(x, y)$, n=1, 2, 3, 4 . . . ; and, for every pixel position (x, y), fitting coefficients $a_n(x, y)$ which minimize a suitable spatially weighted cost function, e.g.:

$$CF(\alpha_n] = \sum_{x'}\sum_{y'}K(x-x', y-y')f\left[S(s', y') - \sum_n \alpha_n(x, y)b_n(x', y')\right]$$

The function $f(\cdot)$ can be a standard least square cost function or any other suitable cost function. The weight $K(x-x', y-y')$ is in general a spatially localized function around the point (x, y). The "width" of the function determines how "local" the estimators in (x, y) are. For instance, a "narrow" weight means that only points very close to (x, y) are relevant in the fit, and therefore the estimator will be very local. At the same time, since fewer points are used, the estimator will be noisier.

There are many choices for the weights. Examples of choices (non-exhaustive) include exponential, factorized Bessel functions, radial functions, an apodization window, any finite response filter, and any function matching the point spread function of the optical sensor, either analytically approximated, simulated, or experimentally measured.

This analysis can be used to determine local phases $$\phi_A(x, y) = a\tan 2(\alpha_3(x, y), \alpha_3, (x, y)$$

11
-continued $$\phi_B(x,\,y) = a\tan 2(\alpha_5(x,\,y),\,\alpha_4,\,(x,\,y)$$

This local phase is relevant because it is proportional to the aligned position (LAPD) as measured from a grating for an alignment sensor. As such, in the context of alignment, LAPD can be determined from the local phase map or local phase distribution. Local phase is also proportional to the overlay measured, for instance, using acDBO mark.

This procedure is thus used to determine an aligned position locally within the mark. In other words, an aligned position is determined for each point in the mark or at least a subset of points in the mark. This is plotted as a "local aligned position map." More precisely, this may be plotted as two local aligned position maps, one for LAPD_x (as function of wafer coordinate) and one for LAPD_y (as function of wafer coordinate).

Figure 2A:
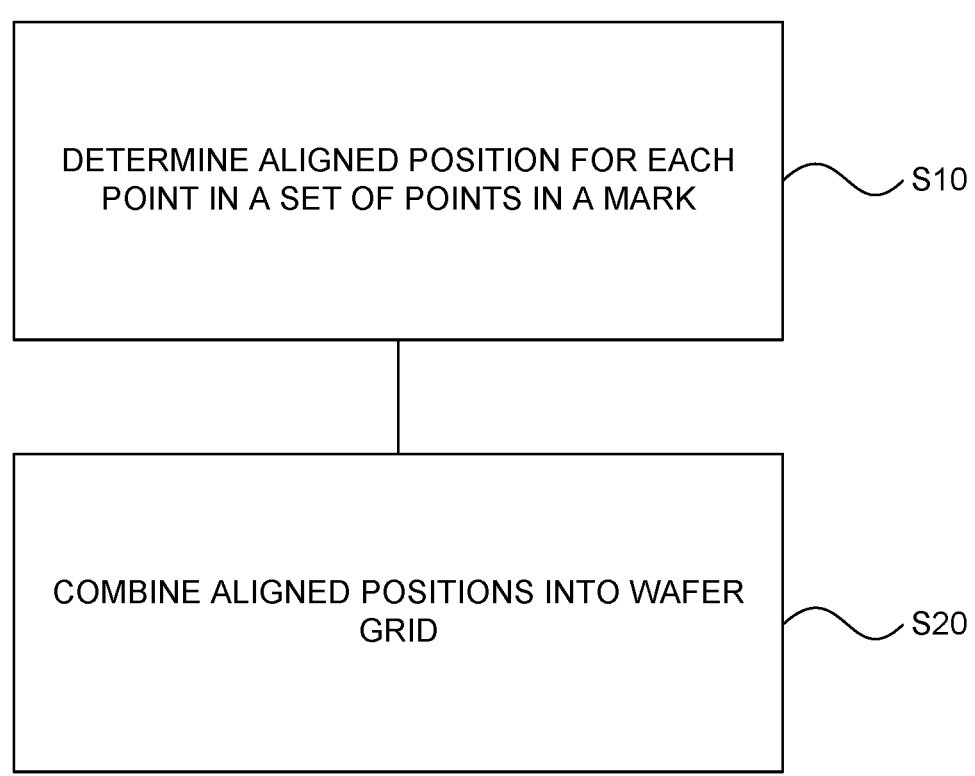
FIG. 2A is a flowchart showing a process for determining a wafer grid based on alignment position deviation measurements according to an aspect of an embodiment.

Thus, according to an aspect of an embodiment, first an aligned position (APD_x, APD_y) is determined per mark from the local aligned position map. Then, the aligned positions per mark are combined into a wafer grid. This is shown in FIG. 2A, in which in a step S10 an aligned position is determined for each point in a set of points in a mark and then in a step S20 the aligned positions are combined into wafer grid.

Figure 2B:
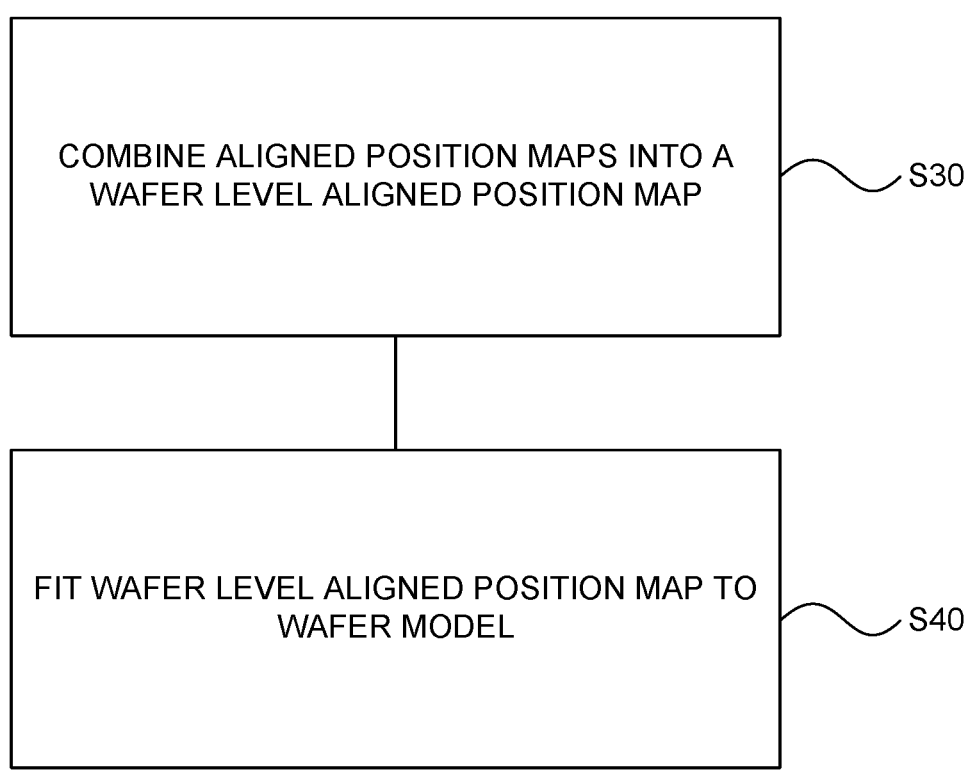
FIG. 2B is a flowchart showing a process for determining a wafer model based on alignment position deviation measurements according to an aspect of an embodiment.

Further, according to an aspect of an embodiment, the wafer grid fit is performed on the local aligned position maps. This may be accomplished, for example, by first combining all local aligned position maps into a wafer-level local aligned position map (e.g. on 30×30 cm scale). Then the wafer-level local aligned position map is fit to a wafer model (e.g. a Higher Order Wafer Alignment model up to the third order (HOWA3) or Radial Basis Functions (RBF) model). This is shown in FIG. 2B, in which in a step S30 the aligned position maps are combined into a wafer level aligned position map and then in a step S40 the wafer level aligned position map is fit to a wafer model.

As an optional intermediate step it is possible to linearize the local aligned position maps per mark. This is similar to first determining wafer deformation gradient per mark (or Rz per mark) and then using wafer deformation gradient per mark (or Rz per mark) in the wafer grid fit.

If, however, the local aligned position maps are not linearized, then the quadratic (at mark level) wafer deformation terms may be used in the wafer grid fit. In other words, it is possible to determine the second order derivative of the wafer deformation from a single mark measurement.

One of ordinary skill in the art will readily appreciate that this approach also generalizes to higher than second order terms The gradient of APD_y at the point (x, y) with respect to the wafer coordinate x may be expressed as the limit of dAPD_y(x,y)/dx which is mathematically equivalent to (APD_y(x+D/2,y)−APD_y(x−D/2,y))/D as D approaches zero. It will be appreciated that two uDBO mark segments may be displaced in both x and y. Therefore, speaking rigorously, using only this information it is possible to distinguish only two wafer deformation gradients, i.e. the gradient of APD_y along one diagonal and the gradient of APD_x along the other diagonal, depending on the mark design. Using all four wafer deformation gradients dAPD_x/dx, dAPD_x/dy, dAPD_y/dx, and dAPD_y/dy. i.e., four dimensions per mark the makes it possible to distinguish all four gradients (e.g. distinguish dAPD_y/dx from dAPD_y/dy), because the two gradients are distinguishable in a local aligned position map. This in principle constitutes four dimensions per mark and includes wafer shearing/compression type of terms.

For some applications, however, additional benefits may flow from determining only the linearized gradient or Rz. FIG. 2 illustrates a wafer 200 with a wafer grid 210 superposed in the wafer 200. Also shown in FIG. 2 is a group of marks 220. Each mark 220 has an associated measured APD. The marks 230 are generally a subset of all of the marks on the wafer 200. Although in the figure eighteen marks 220 are shown it will be understood that the number of marks examined may be significantly greater than this. The APD for each mark is indicated by the respective arrow 230 with the direction of the arrow indicating the direction of the deviation and the length of the arrow indicating the magnitude of the deviation. As can be seen, the APD may include an x component and a y component. The APD can also be expressed in terms of a radial component.

Figure 3:
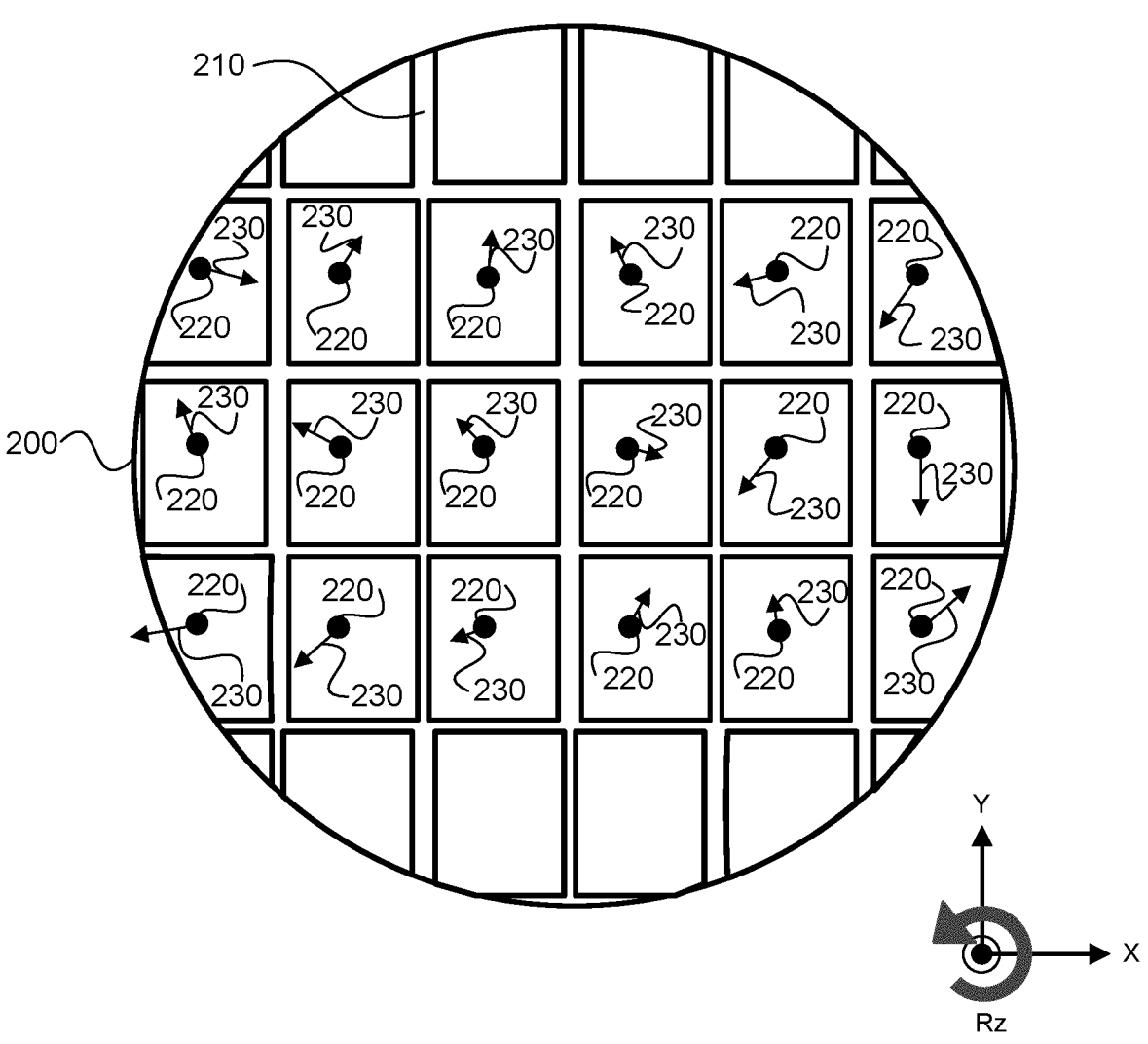
FIG. 3 is a schematic representation of a semiconductor wafer with a superposed grid dividing the wafer surface and an indicated alignment position deviation for each mark.

FIG. 3 illustrates an example in which one mark is measured per field in a subset of fields of the grid. This is for purely the purposes of explaining principles. In practice the correspondence between fields in the grid and the measured marks is not one-to-one. In other words, it is not necessarily the case that exactly one mark is measured per field. Instead, these are other possible scenarios. For example, alignment marks may be measured for only a subset of fields (for example measure 40 marks when there are 100 fields). Also, multiple alignment marks could be measured in one or more fields. For different fields, alignment marks could be measured that are located at different locations within the field (for example, for a first field one could measure an alignment mark in the top left part of the field, for a second field one could measure a mark in the bottom right of the field, and so on. This would be an example of a distributed sampling schemes.

Figure 4A:
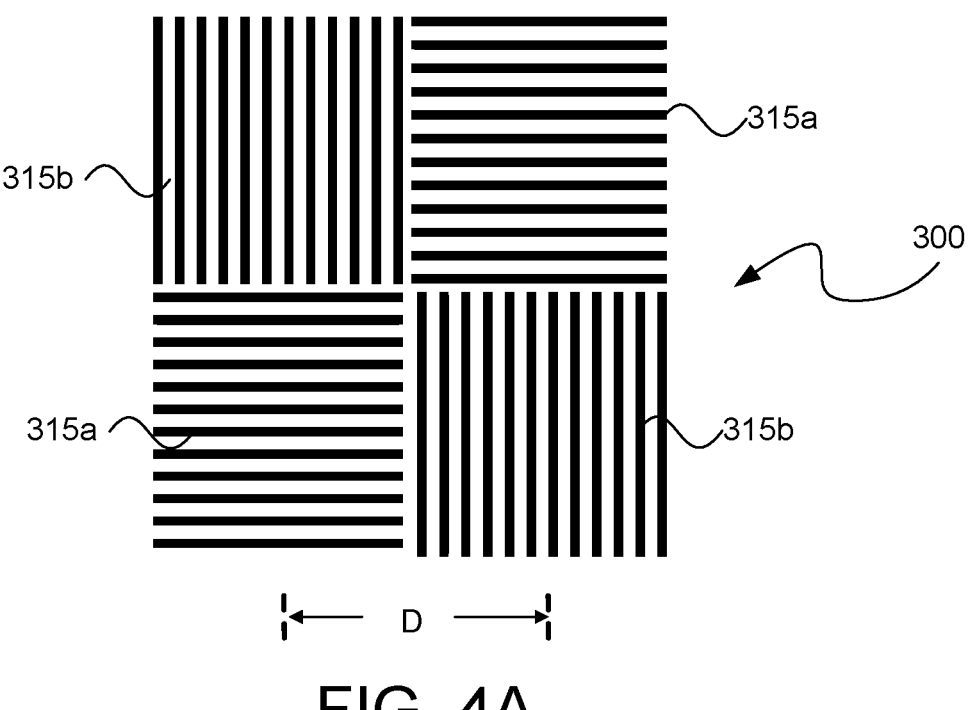
FIG. 4A is a diagram of an example of a first type of alignment mark.
Figure 4B:
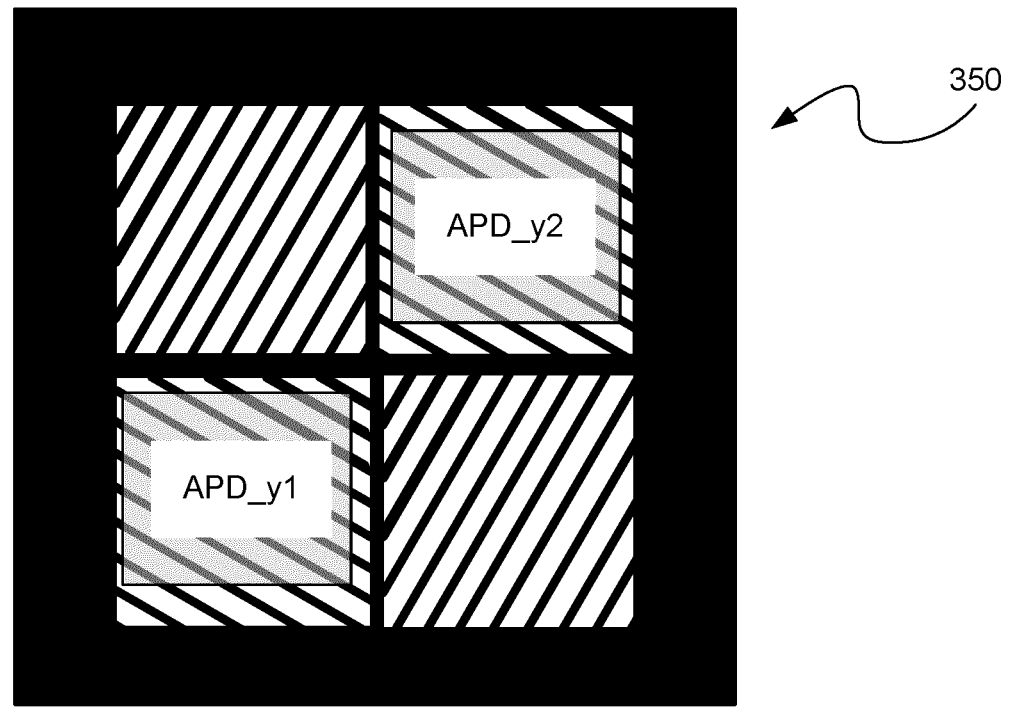
FIG. 4B is a diagram of an interference pattern as might be obtained using the alignment mark of FIG. 4A.

FIGS. 4A and 4B show some aspects of a system such as that disclosed in WIPO International Pub. No. WO 2020/057900 related to determination of APD. FIG. 4A illustrates a target 310 which is an example of a uDBO alignment mark that can be used as an alignment mark in some embodiments. The target 310 comprises four sub-targets, comprising two gratings (periodic structures) 315a in a first direction (x-direction) and two gratings 315b in a second, perpendicular, direction (y-direction). The pitch of the gratings may be in the range, for example, of 300-800 nm. The target 300 has a characteristic linear dimension D which in the case of the example depicted in FIG. 4A is the distance in x between the centers of the y-gratings 315b.

In a manner similar to other metrology devices usable for alignment sensing, a shift in the target grating position causes a phase shift between the +1 and −1 diffracted orders per direction. Because the diffraction orders interfere on the camera, a phase shift between the diffracted orders results in a corresponding shift of the interference fringes on the camera. Therefore, it is possible to determine the alignment position from the position of the interference fringes on the camera as explained in WIPO International Pub. No. WO 2020/057900.

The captured orders include the −1 x direction diffraction order, a +1 x direction diffraction order, a −1 y direction diffraction order, and a +1 y direction diffraction order. These diffraction orders are imaged on the camera where they interfere forming a fringe pattern 450, such as shown in FIG. 4B. In the example shown, the fringe pattern is diagonal as the diffracted orders are diagonally arranged in the pupil, although other arrangements are possible with a resulting different fringe pattern orientation. As can be seen, the fringe patterns yield two APD measurements for each x and y dimension, for example, for the y dimension, APD_y1 and APD_y2.

Figure 5A:
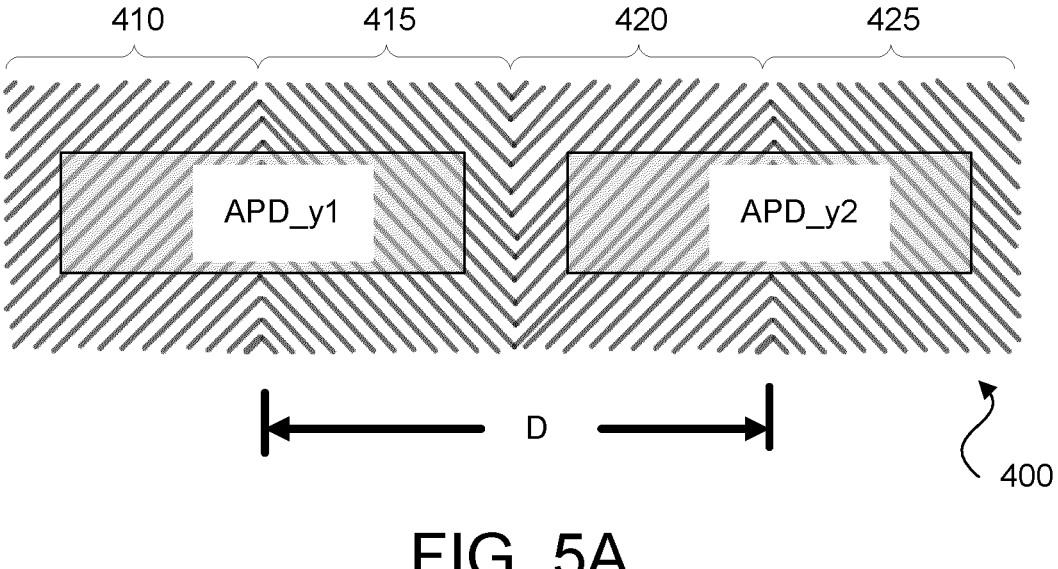
FIG. 5A is a diagram of an example of another type of alignment mark and FIG. 5B is a diagram of an example of yet another type of alignment mark

FIG. 5A illustrates the application of the same principles to another type of alignment mark 400 which is a variation of the standard BF mark mentioned above. The mark 400 is made up of a first segment 410 having lines slanting upward left-to right, a second segment 415 having lines slanting downward left-to right, a third segment 420 having lines slanting upward left-to right, and a fourth segment 425 having lines slanting downward left-to right. Again, measurement of this mark 400 can yield two APDS for each dimension, for example, for the y dimension, APD_y1 from segments 410 and 415 and APD_y2 from segments 420 and 425. The target 400 also has a characteristic linear dimension D which in the case of the example depicted in FIG. 4A is the pattern repeating distance, i.e., the distance in the x direction in the example where the y APDs are determined. If the APDs are determined for x at two y coordinates, then the characteristic dimension would be a dimension D2 orthogonal to D.

Figure 5B:
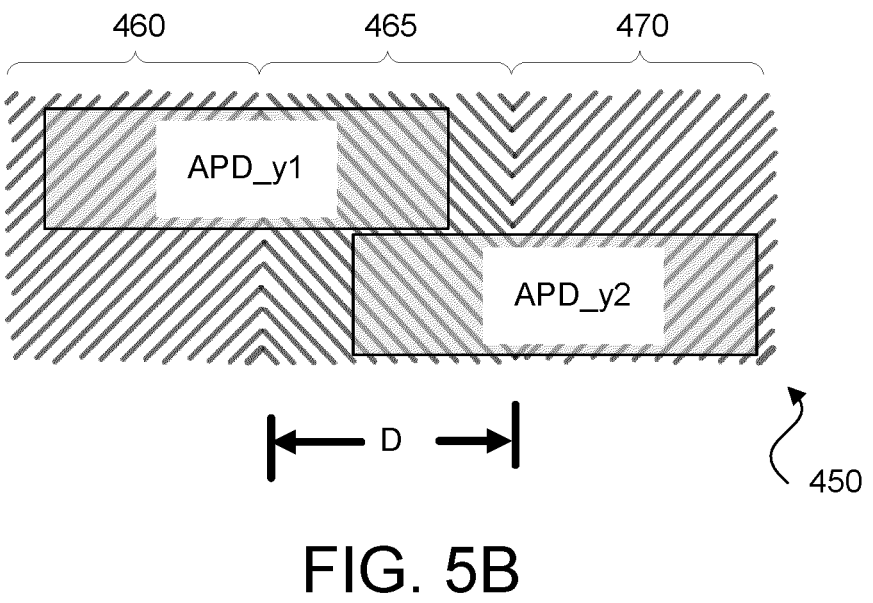

FIG. 5B illustrates the application of the same principles to another type of alignment mark 450. The mark 450 is made up of a first segment 460 having lines slanting upward left-to right, a second segment 465 having lines slanting downward left-to right, and a third segment 470 having lines slanting upward left-to right. Again, measurement of this mark 450 can yield two APDS for each dimension, for example, for the y dimension, APD_y1 from segments 460 and 465 and APD_y2 from segments 465 and 470. The target 450 also has a characteristic linear dimension D which in the case of the example depicted in FIG. 4B is the distance in the x direction in the example where the y APDs are determined. If the APDs are determined for x at two y coordinates, then the characteristic dimension would be a dimension D2 orthogonal to D.

According to another aspect of an embodiment, the multiple APD's can be used as bases for deriving additional grid characterizing parameters. The description which follows primarily uses Rz, the local rotation of a mark from which the APDs were measured, as an example of such a grid characterizing parameter. It will be understood, however, that the APDs can be used to determine other grid characterizing parameters such as a gradient of the wafer grid deformation.

Thus, according to an aspect of an embodiment, Rz, the rotation of the mark about the z axis, is determined in addition to the x and y positions of the mark. This additional information may then be used to model or otherwise characterize the wafer grid more accurately. The net effect is essentially the same as measuring more marks but without using additional wafer real estate and without consuming additional measurement time at the cost of decreasing throughput.

In the description that follows, the APD in the y-direction is used as an example for the determination of Rz, but the same principles apply if APD_x is measured and used. In this example, determining Rz effectively makes a contribution to model accuracy comparable to measuring more marks. It effectively generates four measurements instead of two, permitting fitting to a model with four parameters instead of two parameters. In some applications it may be possible that the gradient in x (or Rz determined from x segments) gives essentially the same result as the gradient in y (or Rz determined from the y segments). In such cases it will be possible to fit three parameters instead of two.

In particular, an average APD for a mark can be calculated as $$APD\_y = (APD\_y1 + APD\_y2)/2.$$

According to an embodiment, the rotation about the z axis can be calculated using an expression such as $$Rz = atan((APD\_y2 - APD\_y1)/D)$$

For small D this may be approximated as $$Rz = (APD\_y2 - APD\_y1)/D$$

It will be appreciated by those skilled in the art that alternative expressions, such as more accurate expressions including sine terms, can be used instead.

Also, in terms of region of interest selection, it is possible according to an embodiment to use custom regions of interest such as only "good" mark areas in the APD determination by excluding the use of "bad" mark areas. In other words an optimized area (region of interest) may be used, or weighted pixel combination on a target-by-target basis, based on one or more KPIs, where example KPIs may include one or more of local uniformity of the image, local uniformity of the (local) alignment position determined from the image, minimal local color-to-color image variation, minimal local color-to-color alignment position variation and so on as described in WIPO International Pub. No. WO 2020/057900, referred to above. When custom regions-of-interest are used, the above expression for Rz can be adjusted in a manner within the skill of the ordinary artisan to obtain a correct value of the Rz.

It is also possible to define two ROI's and determine Rz (or the gradient) even for marks that have only one segment.

Also, for some applications and embodiments, it is not necessary to define two ROIs. For example, it is possible to make a continuous map that locally describes the APD for every point on the mark. This may be referred to as the "local APD" or "LAPD." As an alternative to the expression given above for Rz, Rz, or the gradient of APD_y, can be directly determined from the gradient in the LAPD.

As another example, for both the ORION or SMASH type sensor implementations, APDs can be determined as function of mark position (or mark scan position). Thus it is not necessary to distinguish two ROIs in order to determine an APD in systems that use such sensor implementations.

In general, as broadly conceived and implemented, some embodiments involve correlating alignment signals to Rz or the gradient in the wafer deformation grid and using that correlation to determine the wafer deformation grid more accurately.

Figure 6A:
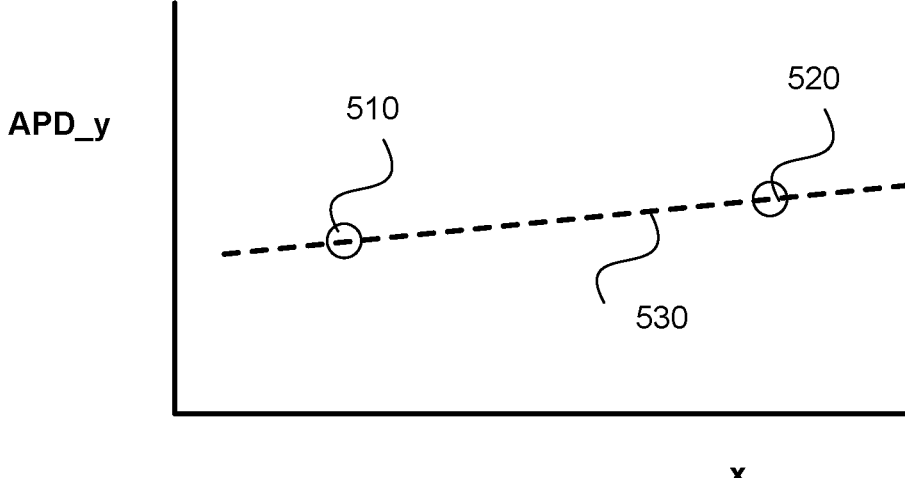
FIG. 6A is a graphical representation of using alignment position deviation measurements to obtain a fitting curve for wafer deformation.
Figure 6B:
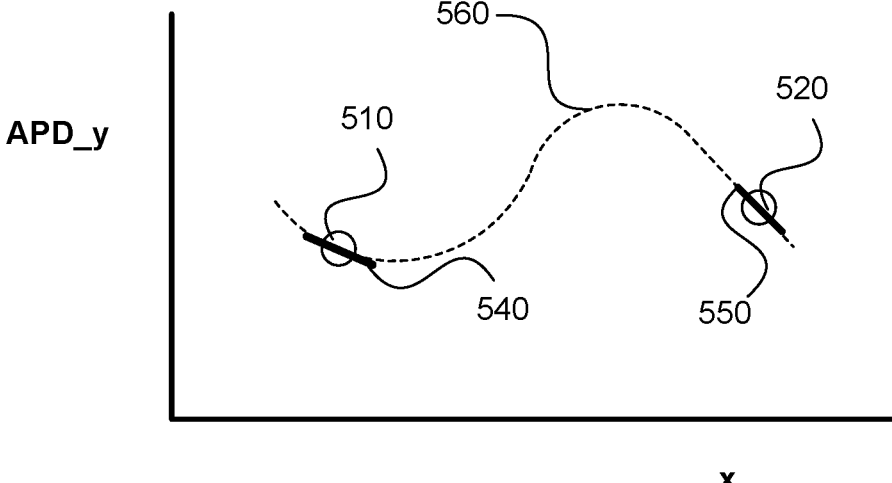
FIG. 6B is a graphical representation of using alignment position deviation measurements and a derived rotation determination to obtain a fitting curve for wafer deformation according to an aspect of an embodiment.

As an example of the potential benefits of this approach, FIG. 6A shows APD-Y calculated at two different x positions 510 and 520. The line 530 represents the results of a first order grid fit. In FIG. 6B, however, a first Rz value 540 is determined at position 510 and a second Rz value 550 is determined at the position 550. From this, a third order fit 560 can be obtained which more accurately models alignment mark distortion.

Again, Rz can also be determined from the x-grating segments. In principle two separate Rz could be determined, one from the x-grating segments and the other from the y-grating segments. This would essentially represent a local wafer skew or shear parameter. An average RZ can be computed as an average of the Rz determined from y segments and the Rz determined from x segments.

Rz could in general be used to fit many different types of higher order (intrafield) wafer grids and reduce the impetus to measure more alignment marks.

In accordance with another aspect of an embodiment, one application in which the benefits of an implementation may be especially pronounced is to accurately fit the wafer edge. The wafer edge is an especially challenging position for obtaining an accurate fit of the wafer deformation.

Even with two marks close to the wafer edge it is still difficult to fit the edge accurately for several reasons, including the forces to which the edge is subjected to during clamping. However, if Rz is obtained in addition to obtaining x and y, then the fit can be more accurate without having to add or measure more marks and without sacrificing throughput.

For example, there is always a single mark (in the radial direction) which is closest to the wafer edge. Any model that describes the wafer deformation has to extrapolate what happens between this last mark and the real wafer edge. To extrapolate accurately, it is very helpful when the gradient is known, at the location of the last mark (i.e. at the last measurement point).

Figure 7:
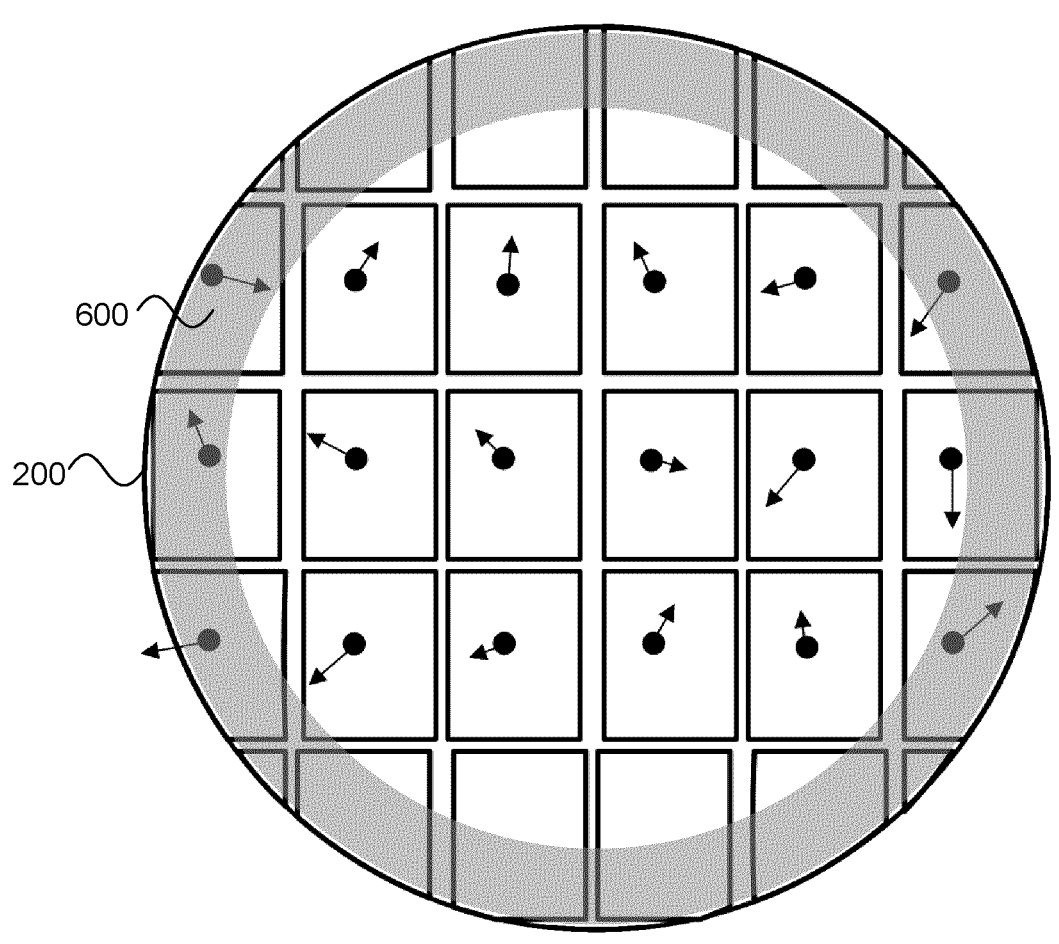
FIG. 7 is a schematic representation of a semiconductor wafer with a superposed grid dividing the wafer surface and an indicated alignment position deviation for each mark with an indicated edge region.

Thus, as shown in FIG. 7, a wafer 200 has an edge region 600. As indicated above, obtaining an accurate model in the region 600 is particularly difficult. FIG. 7A shows APD as a function of the distance R from to the center of the wafer 200 for three marks, 700, 710, and 720. It should be appreciated that APD is in reality a 2D function of two parameters, e.g., [APD_x, APD_y]=f(x,y), where f describes the wafer deformation. FIG. 7A is a plot against one dimension, R, to facilitate explanation of the concept. The plot could also be as function of x or y.

Figure 8A:
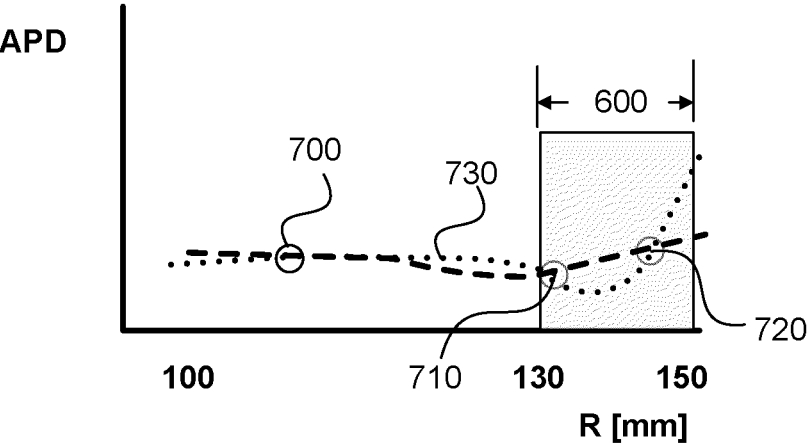
FIG. 8A is a graphical representation of using alignment position deviation measurements to obtain a fitting curve for wafer deformation in an edge region.
Figure 8B:
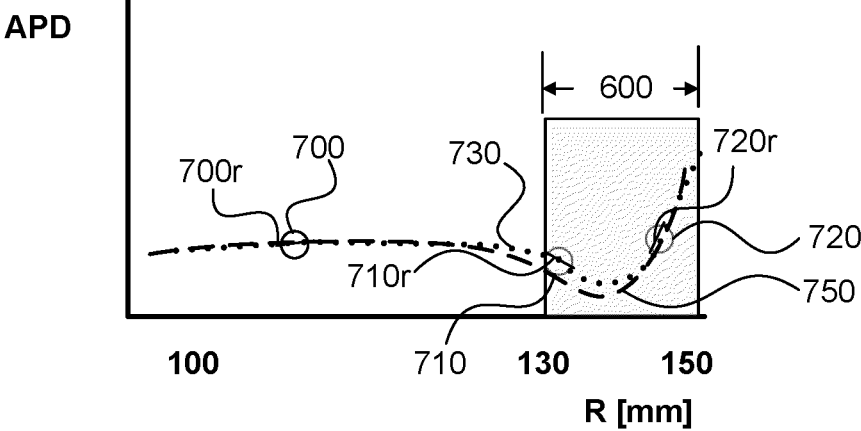
FIG. 8B is a graphical representation of using alignment position deviation measurements and derived rotation determinations to obtain a fitting curve for wafer deformation in an edge region according to an aspect of an embodiment.

The curve 730 in FIG. 8A shows true wafer deformation. The curve 740 shows the attempted fit using only APD data from the three marks 700, 710, and 720. As can be appreciated, even with two marks relatively close to the edge of the wafer it remains difficult to fit the edge region accurately. In FIG. 8B, however, an Rz value 700$r$ is determined for mark 700, an Rz value 710$r$ is determined for mark 710, and an Rz value 720$r$ is determined for mark 720. These values are then used in addition to the respective APD values to obtain a higher order fit 750 that more accurately represents the true deformation 730 especially in the edge region 600. As one of ordinary skill in the art will appreciate, the fit curve 750 fit should pass exactly through the measurement points such as point 710$r$ (assuming there's no measurement noise etc.). The offset shown in the figure has been added to improve legibility.

In some embodiments, mark segments can be placed at an increased distance from each other. In some embodiments, they could be placed close to opposite edges of the field of view of the sensor. This could be beneficial to increase accuracy and reproducibility of the Rz measurement, thereby improving the quality of the fitted wafer grid.

Figure 9:
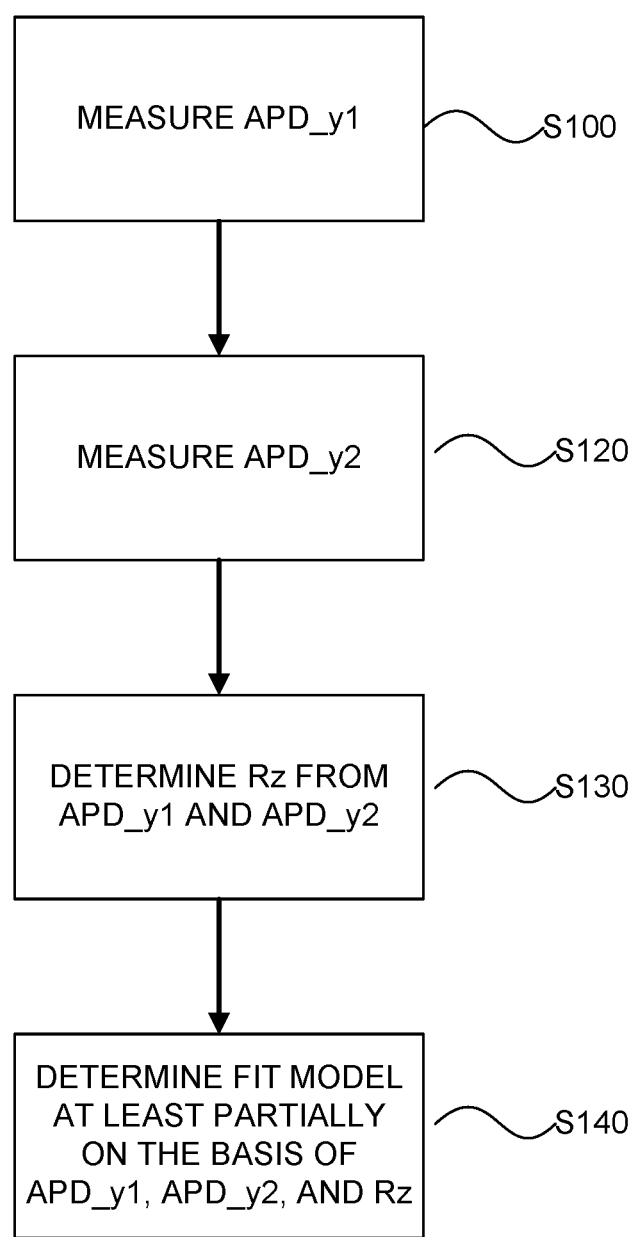
FIG. 9 is a flowchart showing a process for determining a fit model based on alignment position deviation measurements and derived rotation determinations according to an aspect of an embodiment.

In accordance with another aspect of an embodiment, a method for obtaining an enhanced fit model for a semiconductor wafer is shown in the flowchart in FIG. 9. The process as depicted starts with a step S100 of measuring alignment position deviation for a mark in a first dimension (y in the example). Then, in a step S120, a second alignment position deviation is measured for the mark in the same dimension. In a step S130, a rotation of the mark about the z axis is obtained based at least in part on the measurements in steps S100 and S120. Then, in a step S140, a fit model is determined based at least in part on the alignment position deviation measurements and the determined rotation.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The embodiments can be further described using the following clauses:

1. A metrology device comprising:

an optical system configured to collect radiation that has interacted with an alignment mark on a substrate; and a processing system configured to receive and derive information from the collected radiation and to determine an aligned position for at least each of a subset of points in the alignment mark therefrom, the processing system being further configured to determine four wafer deformation gradients dAPD_x/dx, dAPD_x/dy, dAPD_y/dx, and dAPD_y/dy based on the aligned positions.

2. The metrology device as in clause 1 wherein the processor is configured to use the four wafer deformation gradients to perform a wafer grid fit.

3. A metrology device comprising:

an optical system configured to collect radiation that has interacted with an alignment mark on a substrate; and a processing system configured to receive and derive information from the collected radiation and to determine at least two alignment position deviations (APDs) of the alignment mark therefrom, the processing system being further configured to determine at least one of a gradient measurement or a rotation measurement Rz based at least in part on the at least two APDs.

4. The metrology device as in clause 3 wherein the at least one alignment mark has a characteristic linear dimension D and the processing system is additionally configured to determine the rotation measurement Rz based at least in part on D.

5. The metrology device as in clause 3 wherein the substrate lies in a plane that extends in an x dimension and in a y dimension orthogonal to the x dimension, wherein the at least two APDs are in one of the x dimension and the y dimension, and the rotation measurement Rz is around an axis extending through the alignment mark in a z dimension orthogonal to the x dimension and the y dimension.

6. The metrology device as in clause 5 wherein a first one of the at least two APDs is a first ADP in the y dimension APD_y1 and a second one of the at least two APDs is a second APD in the y dimension APD_y2 and wherein Rz is determined as a difference between APD_y1 and APD_y2 divided by D.

7. The metrology device as in clause 6 wherein the processing system is additionally configured to determine a first x APD in the x dimension APD_x1 and a second x APD in the x dimension APD_x2 and wherein a second Rz is determined as a difference between APD_x1 and APD_x2 divided by a characteristic linear dimension D2.

8. The metrology device as in clause 3 wherein the optical system is configured to collect radiation that has interacted with a plurality of alignment marks and the processing system is additionally configured to receive and derive information from the collected radiation from each of the plurality of alignment marks and to determine at least two APDs for each of the plurality of alignment marks therefrom, the processing system being further configured to determine at least one rotation measurement Rz for each of the plurality of alignment marks based at least in part on the respective at least two APDs for each of the plurality of alignment marks, and wherein the processor is further configured to determine a rotation gradient for the substrate based at least in part on the at least one rotation measurement Rz for each of the plurality of alignment marks.

9. The metrology device as in clause 3 wherein the optical system is configured to collect radiation that has interacted with a plurality of alignment marks and the processing system is additionally configured to receive and derive information from the collected radiation from each of the plurality of alignment marks and to determine at least two APDs for each of the plurality of alignment marks therefrom, the processing system being further configured to determine at least one rotation measurement Rz for each of the plurality of alignment marks based at least in part on the respective at least two APDs, and wherein the processor is further configured to determine a mathematical fit for a wafer model for the substrate based at least in part on the at least one rotation measurement Rz for each of the plurality of alignment marks.

10. The metrology device as in clause 9 wherein the mathematical fit is a polynomial fit.

11. A metrology method comprising:
causing radiation to interact with at least one alignment mark on a substrate lying substantially in a plane;
sensing the radiation;
determining an aligned position for at least each of a subset of points in the alignment mark; and
determining four wafer deformation gradients dAPD_x/dx, dAPD_x/dy, dAPD_y/dx, and dAPD_y/dy based on the aligned positions.

18

12. A metrology method comprising:
causing radiation to interact with at least one alignment mark on a substrate lying substantially in a plane;
sensing the radiation;
determining at least two alignment position deviations (APDs) of the at least one alignment mark from the radiation; and
determining at least one rotation measurement Rz orthogonal to the plane of the at least one alignment mark based at least in part on the at least two APDs based at least in part on the at least two APDs.

13. The metrology method as in clause 12 wherein the at least one alignment mark has a characteristic linear dimension D and wherein determining the at least one rotation measurement Rz is based at least in part on D.

14. The metrology method as in clause 13 wherein the plane extends in an x dimension and in a y dimension orthogonal to the x dimension, wherein the at least two APDs are in one of the x dimension and the y dimension, and the rotation measurement Rz is around an axis extending through the alignment mark in a z dimension orthogonal to the x dimension and the y dimension.

15. The metrology method as in clause 14 wherein a first one of the at least two APDs is a first alignment position deviation in the y dimension APD_y1 and a second one of the at least two APDs is a second alignment position deviation in the y dimension APD_y2 and wherein Rz is determined as a difference between APD_y1 and APD_y2 divided by D.

16. The metrology method as in clause 15 additionally comprising:
determining a first x alignment position deviation in the x dimension APD_x1 and a second x alignment position deviation in the x dimension APD_x2; and
determining a second Rz as a difference between APD_x1 and APD_x2 divided by a characteristic linear dimension D2.

17. The metrology method as in clause 12 wherein
causing radiation to interact with at least one alignment mark on a substrate lying substantially in a plane comprises causing radiation to interact a plurality of alignment marks on a substrate lying substantially in a plane,
determining at least two APDs of the at least one alignment mark from the radiation comprises determining at least two APDs for each of the plurality of alignment marks, and
determining at least one rotation measurement Rz comprises determining at least one rotation measurement Rz for each of the plurality of alignment marks based at least in part on the respective at least two APDs, and
further comprising determining a rotation gradient for the substrate based at least in part on the at least one rotation measurement Rz for each of the plurality of alignment marks.

18. The metrology method as in clause 12 wherein
causing radiation to interact with at least one alignment mark on a substrate lying substantially in a plane comprises causing radiation to interact a plurality of alignment marks on a substrate lying substantially in a plane,
determining at least two APDs of the at least one alignment mark from the radiation comprises determining at least two APDs for each of the plurality of alignment marks, and
determining at least one rotation measurement Rz comprises determining at least one rotation measurement Rz for each of the plurality of alignment marks based at least in part on the respective at least two APDs, and further comprising determining a polynomial fit for a wafer model for the substrate based at least in part on the at least one rotation measurement Rz for each of the plurality of alignment marks.

19. A metrology method comprising:
obtaining an alignment position deviation measurement
correlating the alignment position deviation measurement to at least one of a rotation amount and a wafer deformation gradient; and
approximating an actual wafer grid deformation on the basis of the rotation amount or the wafer deformation gradient.

20. The metrology method as in clause 19 wherein the alignment position deviation measurement comprises measuring a mark position.

21. The metrology method as in clause 19 wherein the alignment position deviation measurement comprises measuring at least two discrete alignment position deviations.

22. The metrology method as in clause 19 wherein the alignment position deviation measurement comprises measuring a continuous alignment position deviation.

23. The metrology method as in clause 19 wherein approximating an actual wafer grid deformation on the basis of the rotation amount or the wafer deformation gradient comprises mathematically fitting the rotation amount or the wafer deformation gradient.

The invention claimed is:

1. A metrology device comprising:
an optical system configured to collect radiation that has interacted with an alignment mark on a substrate; and
a processing system configured to receive and derive information from the collected radiation and to determine an aligned position for at least each of a subset of points in the alignment mark therefrom, the processing system being further configured to determine four wafer deformation gradients, the wafer deformation gradient of the alignment mark displacement (APD) with respect to x in the x direction dAPD_x/dx, the wafer deformation gradient of APD with respect to x in the y direction dAPD_x/dy, the wafer deformation gradient of APD with respect to y in the x direction dAPD_y/dx, and the wafer deformation gradient of APD with respect to y in the y direction dAPD_y/dy based on the aligned positions.

2. The metrology device of claim 1 wherein the processing system is configured to use the four wafer deformation gradients to perform a wafer grid fit.

3. A metrology device comprising:
an optical system configured to collect radiation that has interacted with an alignment mark on a substrate; and
a processing system configured to receive and derive information from the collected radiation and to determine at least two alignment position deviations (APDs) of the alignment mark therefrom, the processing system being further configured to determine at least one of a gradient measurement or a rotation measurement Rz based at least in part on the at least two APDs.

4. The metrology device of claim 3 wherein the at least one alignment mark has a characteristic linear dimension D and the processing system is additionally configured to determine the rotation measurement Rz based at least in part on D.

5. The metrology device of claim 3 wherein the substrate lies in a plane that extends in an x dimension and in a y dimension orthogonal to the x dimension, wherein the at least two APDs are in one of the x dimension and the y dimension, and the rotation measurement Rz is around an axis extending through the alignment mark in a z dimension orthogonal to the x dimension and the y dimension.

6. The metrology device of claim 5 wherein a first one of the at least two APDs is a first ADP in the y dimension APD_y1 and a second one of the at least two APDs is a second APD in the y dimension APD_y2 and wherein Rz is determined as a difference between APD_y1 and APD_y2 divided by D.

7. The metrology device of claim 6 wherein the processing system is additionally configured to determine a first x APD in the x dimension APD_x1 and a second x APD in the x dimension APD_x2 and wherein a second Rz is determined as a difference between APD_x1 and APD_x2 divided by a characteristic linear dimension D2.

8. The metrology device of claim 3 wherein the optical system is configured to collect radiation that has interacted with a plurality of alignment marks and the processing system is additionally configured to receive and derive information from the collected radiation from each of the plurality of alignment marks and to determine at least two APDs for each of the plurality of alignment marks therefrom, the processing system being further configured to determine at least one rotation measurement Rz for each of the plurality of alignment marks based at least in part on the respective at least two APDs for each of the plurality of alignment marks, and wherein the processor is further configured to determine a rotation gradient for the substrate based at least in part on the at least one rotation measurement Rz for each of the plurality of alignment marks.

9. The metrology device of claim 3 wherein the optical system is configured to collect radiation that has interacted with a plurality of alignment marks and the processing system is additionally configured to receive and derive information from the collected radiation from each of the plurality of alignment marks and to determine at least two APDs for each of the plurality of alignment marks therefrom, the processing system being further configured to determine at least one rotation measurement Rz for each of the plurality of alignment marks based at least in part on the respective at least two APDs, and wherein the processor is further configured to determine a mathematical fit for a wafer model for the substrate based at least in part on the at least one rotation measurement Rz for each of the plurality of alignment marks.

10. The metrology device of claim 9 wherein the mathematical fit is a polynomial fit.

11. A metrology method comprising:
causing radiation to interact with at least one alignment mark on a substrate lying substantially in a plane;
sensing the radiation;
determining an aligned position for at least each of a subset of points in the alignment mark; and
determining four wafer deformation gradients, the wafer deformation gradient of the alignment mark displacement (APD) with respect to x in the x direction dAPD_x/dx, the wafer deformation gradient of APD with respect to x in the y direction dAPD_x/dy, the wafer deformation gradient of APD with respect to y in the x direction dAPD_y/dx, and the wafer deformation gradient of APD with respect to y in the y direction dAPD_y/dy based on the aligned positions.

12. A metrology method comprising:
causing radiation to interact with at least one alignment mark on a substrate lying substantially in a plane;
sensing the radiation;

determining at least two alignment position deviations (APDs) of the at least one alignment mark from the radiation; and determining at least one rotation measurement Rz orthogonal to the plane of the at least one alignment mark based at least in part on the at least two APDs based at least in part on the at least two APDs.

13. The metrology method of claim 12 wherein the at least one alignment mark has a characteristic linear dimension D and wherein determining the at least one rotation measurement Rz is based at least in part on D.

14. The metrology method of claim 13 wherein the plane extends in an x dimension and in a y dimension orthogonal to the x dimension, wherein the at least two APDs are in one of the x dimension and the y dimension, and the rotation measurement Rz is around an axis extending through the alignment mark in a z dimension orthogonal to the x dimension and the y dimension.

15. The metrology method of claim 14 wherein a first one of the at least two APDs is a first alignment position deviation in the y dimension APD_y1 and a second one of the at least two APDs is a second alignment position deviation in the y dimension APD_y2 and wherein Rz is determined as a difference between APD_y1 and APD_y2 divided by D.

* * * * *